US007625600B1

(12) United States Patent
Bellitto et al.

(10) Patent No.: US 7,625,600 B1
(45) Date of Patent: Dec. 1, 2009

(54) INHIBITION OF ALUMINUM OXIDATION THROUGH THE VAPOR DEPOSITION OF A PASSIVATION LAYER AND METHOD THEREOF

(76) Inventors: Victor J. Bellitto, 2612 Fort Farnsworth Rd., #1B, Alexandria, VA (US) 22303; John N. Russell, Jr., 3003 Wessynton Way, Alexandria, VA (US) 22309

( * ) Notice: Subject to any disclaimer, the term of this patent is extended or adjusted under 35 U.S.C. 154(b) by 30 days.

(21) Appl. No.: 11/010,701

(22) Filed: Dec. 3, 2004

(51) Int. Cl.
*C23C 16/00* (2006.01)

(52) U.S. Cl. ............................. 427/248.1; 427/255.11; 427/255.14

(58) Field of Classification Search ....................... None
See application file for complete search history.

(56) References Cited

U.S. PATENT DOCUMENTS 3,165,397 A 1/1965 Lobo ............................ 75/0.5
3,318,684 A 5/1967 Gernes et al. ................. 75/0.5
3,578,436 A 5/1971 Becker et al. ................. 75/0.5
4,770,728 A * 9/1988 Berg et al. ..................... 149/11
5,885,321 A * 3/1999 Higa et al. ..................... 75/362
6,077,329 A 6/2000 Higa et al. ..................... 75/722
6,179,899 B1 1/2001 Higa et al. ..................... 75/722
6,682,584 B2 * 1/2004 Pozarnsky et al. ............ 75/332
6,956,283 B1 * 10/2005 Peterson ..................... 257/680
2002/0047172 A1 * 4/2002 Reid .......................... 257/415

FOREIGN PATENT DOCUMENTS

JP 02-199621 * 8/1990

* cited by examiner

*Primary Examiner*—Timothy Meeks
*Assistant Examiner*—Kelly M Gambetta
(74) *Attorney, Agent, or Firm*—Fredric Zimmerman

(57) ABSTRACT

A process for forming a protected metal mass includes forming an unprotected metal mass, vaporizing a layer forming reactant and depositing the layer forming reactant onto the unprotected metal mass, causing the layer forming reactant to bind to the surface of the metal mass as an attached protective layer.

25 Claims, 3 Drawing Sheets

1 L = 1 x $10^{-6}$ Torr · sec

INHIBITION OF ALUMINUM OXIDATION THROUGH THE VAPOR DEPOSITION OF A PASSIVATION LAYER AND METHOD THEREOF

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND OF THE INVENTION

1. Field of the Invention

The present invention provides a vapor deposition process for forming a passivation layer on a bare metal mass and/or surface, such as an aluminum mass and/or surface.

2. Brief Description of the Related Art

Currently, the most successful method for the production of metal nanoparticles is through a metal evaporation and inert gas condensation process. This method offers a high degree of control over the particle size and distribution through the gas selection, operating pressure, and gas flow rate. The disadvantage to this method in the use of metal nanoparticles, such as aluminum in energetic formulations, has been in the excessive relative amounts of oxide to metal required for surface passivation. Aluminum particles may be prepared by metal vapor condensation techniques or decomposition of $AlH_3$—$N(CH_3)_3$ decomposition. These aluminum particles have been passivated by oxygen, with the oxygen forming a shell of aluminum oxide ($Al_2O_3$) over the core of aluminum or by adding the particles to a halogenated polymer slurry and allowing the polymer to set. Both of these methodologies allow oxygen to penetrate to the core of the particle and continue oxidation of the metal center with time and exposure to air. With the continued oxidation, the energy obtained during the combustion results in less than the theoretical maximum either from the incomplete combustion of the aluminum particle, i.e., the oxide layer prevents or retards combustion, or from a large amount of the aluminum, such as from 20% to 40%, being already fully oxidized prior to combustion. For example, U.S. Pat. No. 6,179,899 to Higa et al. discloses passivation of an aluminum powder product in the reaction vessel either by exposing the solution to air before product separation or by controlling the admission of air to the separated, dried powder.

There is a need in the art to provide an improved method for, and product of, passivated metal masses, particularly aluminum masses that contain a large amount of pure aluminum. The present invention addresses this and other needs.

SUMMARY OF THE INVENTION

The present invention includes a process for forming a protected metal mass that includes the steps of forming an unprotected metal mass, vaporizing a layer forming reactant and depositing the layer forming reactant onto the unprotected metal mass, wherein the layer forming reactant binds to the surface of the metal mass as an attached protective layer. The deposited layer may include a moiety resulting from a carboxylic acid derivative, alcohol derivative, thiol derivative, aldehyde derivative, amide derivative or combinations thereof. The protected aluminum mass of the present invention is particularly useful in small sized aluminum particles used in energetic materials, such as explosives, pyrotechnics, gas generators and the like, as well as semiconductor interconnects. The present invention includes the product of the above-described process.

DETAILED DESCRIPTION OF THE PREFERRED EMBODIMENT

The present invention uses vapor deposition, preferably of a carboxyl group containing compound (carboxylic acid), to provide a protective coating on a metal mass. This may include protective coatings, such as a passivation layer, on bare aluminum masses to inhibit oxidation of the aluminum mass, particularly in the form of nanoparticles, coatings for electronic wiring to prevent corrosion and oxidation, and the like. Surface passivation may include functionalization of metal nanoparticles through the vapor deposition of a variety of compounds. Unlike protective layers formed by solution based methods, the present invention provides a vapor process for passivation of metal surfaces.

Figure 1:
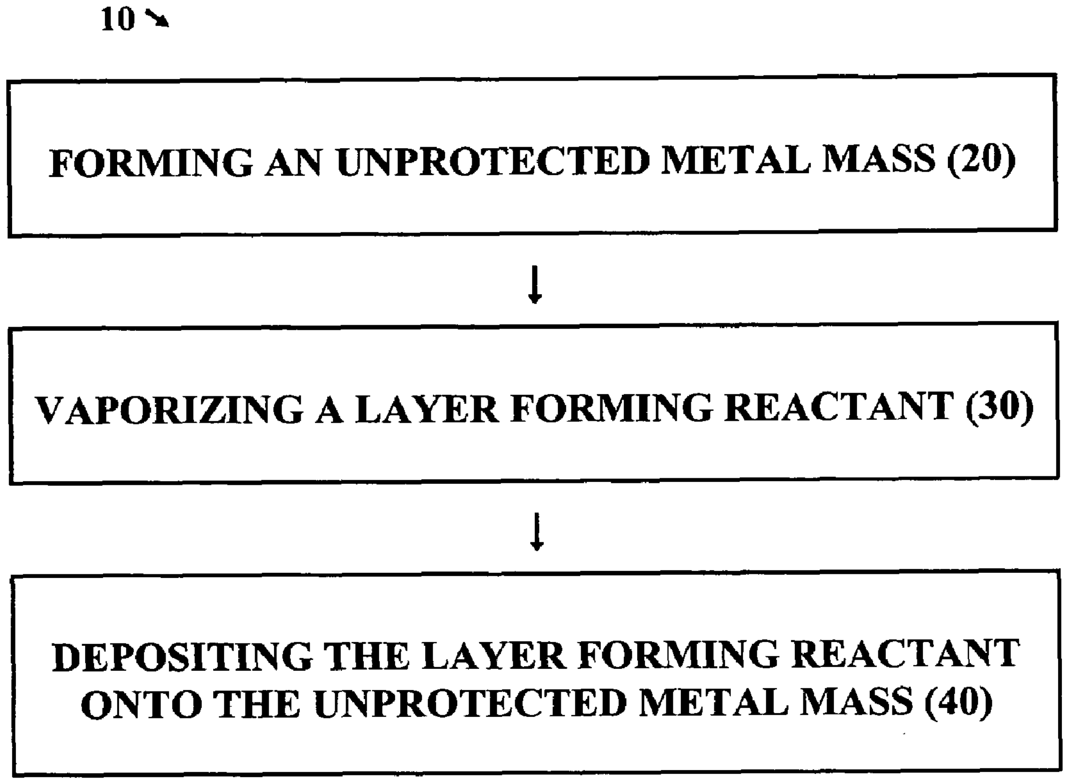
FIG. 1 is a block diagram showing the process of the present invention

As seen in FIG. 1, a process 10 for forming a protected metal mass includes forming 20 an unprotected metal mass, or at least an unprotected portion of the metal mass, vaporizing 30 a layer forming reactant and depositing 40 the layer forming reactant onto the unprotected metal mass. The unprotected metal mass, sometimes referred herein as simply "metal mass," may be present as a vapor, coalescing or in a solid phase. This process causes the layer forming reactant to bind to the surface of the metal mass as an attached protective layer. Metal masses of the present invention include those metals that remain solid under vaporization conditions of the present invention, with selection of an appropriate metal within capabilities of one skilled in the art of metal vaporization or sputter deposition in light of the disclosure herein. Representative metals include, for example, aluminum, copper, iron, steel, boron, nickel, and the like, and combinations thereof. Preferred metals include aluminum and copper, with aluminum, its oxides, composites and alloys, more preferred. Most preferably the metal mass includes a pure aluminum composition. An evaporative dispersion is formed from vaporizing a layer forming reactant that is introduced into the immediate environment or atmosphere of the metal mass. The vaporized reactant then forms the protective layer onto the metal mass. As such, the protective coating increases the usefulness of the metal mass by making the metal mass non-reactive in non-inert environments, e.g., when exposed to an oxygen or water containing atmosphere. The coating includes a deposited layer on the surface of the metal that protects the metal mass from combining with contaminant components, particularly oxygen or water.

In a preferred embodiment, the formation of a passivated aluminum (Al) surface, such as a particle, of the present invention includes a protected aluminum mass comprising pure aluminum with a deposited layer on its surface. The pure aluminum may be formed from any appropriate process for producing purified aluminum, also referred to herein as "bare" or unprotected aluminum. Bare aluminum, particularly in the form of pure fine powders, is pyrophoric. Methods of production include, for example without limitation, exploding an aluminum wire in a vacuum by a high electric current, feeding aluminum wire into high temperature crucible to vaporize the aluminum, etc., with such methods well-known in the art.

Variable uniform sizes of the formed aluminum particles may be created by varying the pressure of the vacuum chamber, pressure of the inert gas, flow rate of the inert gas, type of inert gas, etc. Additionally, the presence of oxygen is minimized, and preferably total eliminated, with proper vacuum, cooling the outside of the reactor wall, and other methods of oxygen and/or water removal from the environment as known in the art. Other metal compositions are formed as known in the art, with the vapor deposition of the present invention for forming a protective or passivating layer onto the metal masses applicable. The metal mass may include any appropriate size or shape for passivation. For metal masses used in energetic materials, shapes may include particles having oval, rod-like, spherical or other appropriate forms, with preferred sizes of these metal particles being nano- or micron-sized metal particles, as determinable by one skilled in the art for a given purpose.

Passivation and oxide inhibition of the formed metal powders occurs by attaching a vapor deposited layer onto the surface of the bare metal of the metal mass. Preferably, the deposited layer includes a layer forming reactant such as a moiety of a carboxylic acid derivative, alcohol derivative, thiol derivative, aldehyde derivative, amide derivative or combinations of these derivatives. Additionally, the deposited layer may include an appropriate corrosion or oxide inhibitor. More preferably the deposited layer includes a carboxylic acid derivative, such as $CH_3CH_2CO_2H$, and other like structures. The deposited layer preferably includes a monolayer attached to the metal mass. Monolayers, for example without limitation, may include a moiety of a carboxylic acid derivative as the protective layer, such as preferably having from about 2 carbon atoms to about 100 carbon atoms, more preferably from about 3 to about 20 carbon atoms, and still more preferably from about 3 to about 12 carbon atoms. Preferably, the carboxylic acid derivative moiety of the present invention includes a perfluoroalkyl carboxylic acid or derivative of a fluoroalkyl carboxylic acid, such as for example, without limitation, $C_3F_5O_2H$, $C_5F_9O_2H$, $C_9F_{17}O_2H$, $C_{10}F_{19}O_2H$, $C_{14}F_{27}O_2H$, $C_3F_3O_2H_3$, $C_5F_7O_2H_3$, or $C_5F_5O_2H_5$. More preferably the carboxylic acid comprises $C_3F_5O_2H$.

Deposited layers are introduced onto the aluminum mass by introducing the reactant in vapor form into a chamber containing the bare aluminum, either in vapor or solid form, under conditions that allow reaction of the bare aluminum with the reactant. The chamber is preferably either under vacuum conditions and/or containing an inert gas.

The weight percentage of the deposited layer on the metal also may be tailored to a given purpose, such as weight percentages of from about 85 weight percent or less of the total protected metal mass, 65 weight percent or less, 50 weight percent or less, 25 weight percent or less, and other such weight percentages including intermediate weight percentages, with variations of the weight percentage providing optimum protective coverage of the metal mass for changes of particle size of the metal mass, changes in the molecular weight of the deposited layer, etc. Preferably attachment or adsorption of the deposited layer forms a protective monolayer against the metal mass. With the attachment of the protective deposited layer as a substantially monolayer structure, a maximum amount of protection occurs with the least amount of material constituting the protective deposited layer. This increases the amount of protected metal for the overall mass of the passivated metal structure.

In one embodiment of the present invention, the deposited layer includes at least one functional group in addition to the group inhibiting oxidation of the metal. This additional functional group or groups may include binders, stabilizers, polymerizeable moieties, energetic moieties, and other such characteristics as desirable. Chemical properties of the nanoparticles may be tailored through the attachment of different functional groups and modification of terminal groups may allow for the assembly of high explosive and/or oxidizer compounds in close-proximity with the aluminum surface. Preferably the deposited layer includes an energetic moiety, such as a burning additive to a metal mass used in propellant compositions. With and without the inclusion of an energetic moiety, the protected metal mass is extremely useful in energetic material compositions, such as propellants, explosives, pyrotechnics, and other such energetic materials that are aided with the addition of a metal component.

The protected metal mass, e.g., aluminum, is produced by forming the unprotected metal mass and adding a monolayer forming reactant to the formed metal mass that preferably occurs prior to any oxidation of the surface of the metal mass. The monolayer forming reactant binds to the surface of the metal mass as the attached protective layer. Protective layers may be incorporated onto metal masses, such as particles, of various shapes and sizes, either with consistent uniform masses or over a broad range of masses for a given batch of particles. Preferably, the present invention includes fine metal powders, such as spherical metal masses having particle sizes substantially less than the about 10 nm to about 200,000 nm, more preferably from about 10 nm to about 15,000 nm, and most preferably from about 10 nm to about 100 nm. With reduced size, the fine metal powders significantly increase the effectiveness of fuels and fuel additives, pyrotechnics, and energetic materials including composites, thermite, and explosives, generally by a factor of from about three to about ten. Increases occur from the more rapid and complete reaction of the finer particles.

The present invention provides passivated metal mass, particularly for macro-sized, micro-sized and nano-sized metal. In addition to energetic fuels and propellant formulations, metallic nanoparticles are also important in the field of powder metallurgy as well as in the field of semiconductor formation. The metal components produced from alloying and sintering of nanoparticles exhibit increased strength and durability over conventional production. The high surface area of the nanoparticles also acts to lower the sintering and alloying temperatures but their excessive oxidation layer creates less ductile and more brittle metal components. Harder and higher-density metal and composite metal nanoparticles will permit the formation of energetic structural materials into shapes, cases and warheads with increased hardness and higher densities for increased energy delivery and penetration. The protective layer on the metal mass may also maintain or improve the metallic properties of the mass, such as electrical conductivity, thermal conductivity, ductility, malleability, etc., and combinations thereof, which may, for example, be useful in semiconductor formation and, in particular, transistor structures.

Example 1

Metal Surface

Figure 2:
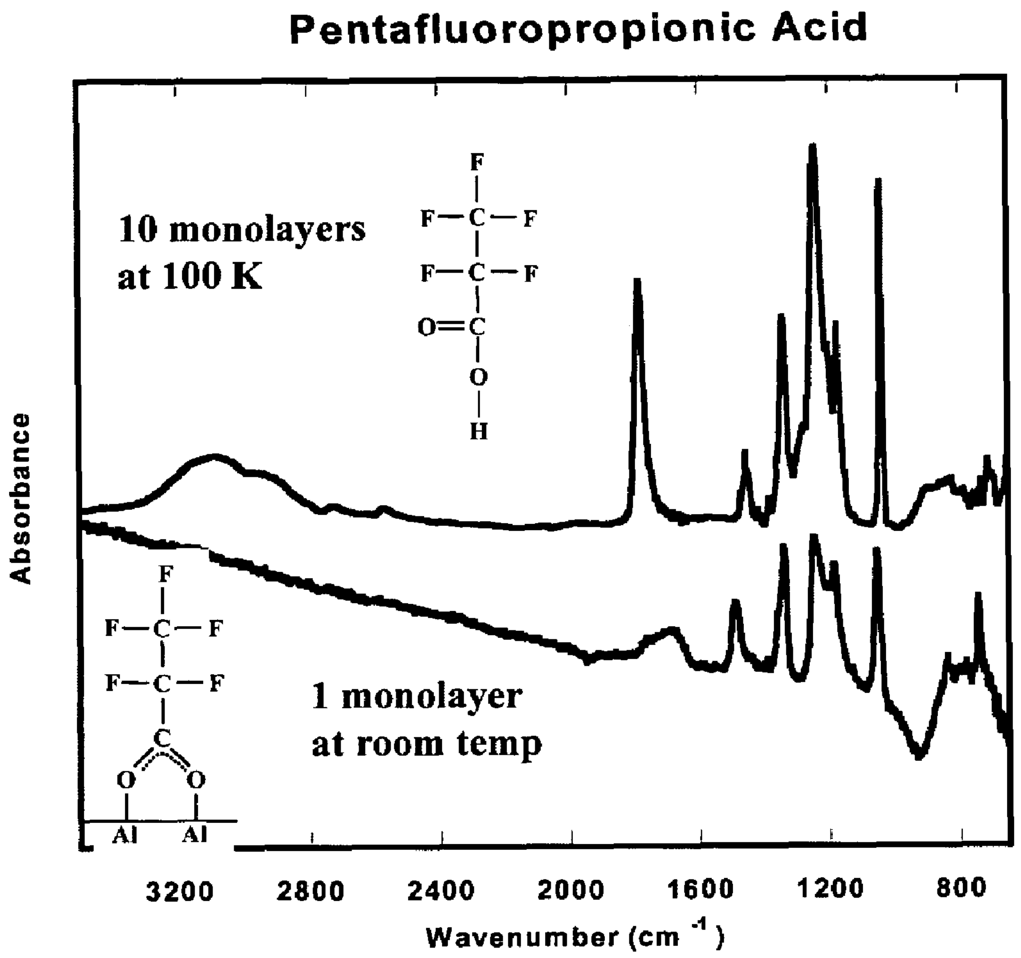
FIG. 2 is an absorbance/wavenumber graph for 10 monolayers of pentafluoropropionic acid adsorbed on an aluminum surface at 130 K, and 1 monolayer of pentafluoropropionic acid adsorbed on an aluminum surface at room temperature; and, FIG. 3 is an absorbance/wavenumber graph for clean aluminum, ½ monolayer of adsorbed $CF_3CF_2COOH$ on an aluminum surface, and 1 monolayer of adsorbed $CF_3CF_2COOH$ on an aluminum surface, each following a 10,000 Langmuir exposure of oxygen.
Figure 3:
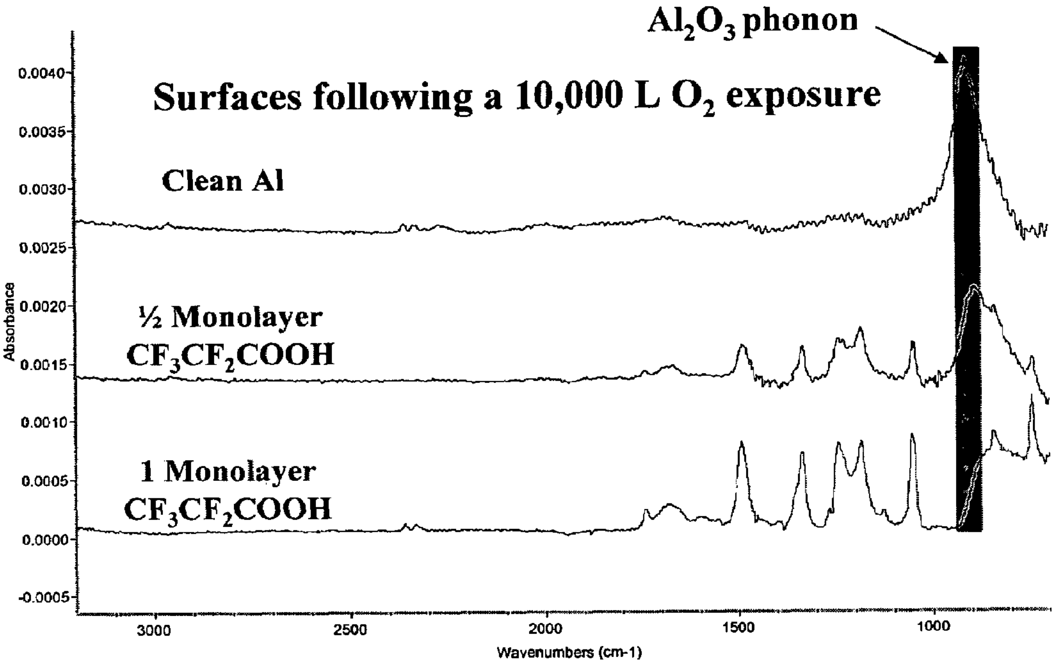

Vapor deposition of $CF_3CF_2COOH$ ("$C_3F_5O_2H$") onto an Al (111) surface was performed under a vacuum of $1\times10^{-10}$ Torr. The aluminum surface was sputter cleaned with 1 KeV $Ar^+$ ions and annealed at a temperature of 800 K, with the elemental cleanliness of the surface verified with X-ray photoelectron spectroscopy (XPS). The passivating layer of either $C_3F_5O_2H$ or $CH_3CH_2O_2H$ was introduced into the vacuum chamber as a vapor, which passivated the aluminum surface and prevented its further oxidation upon exposure to oxygen and/or water. X-ray photoelectron spectroscopy (XPS) was used to provide a compositional analysis of the passivation and functional layer of the nanoparticle surfaces. The characterization of surface bonding and adsorbate orientation was accomplished by IRRAS (infrared reflection absorption spectroscopy) as demonstrated by FIGS. 2 and 3. FIG. 2 shows the spectrum for $C_3F_5O_2H$ that was vapor deposited on the aluminum (111) surface at 100 K (an effective physisorbed forming temperature) and at room temperature. The 100 K spectrum (top) is the infrared spectrum of a physisorbed multilayer which shows for example the O—H modes at approximately 3100 wavenumbers and the C═O mode at approximately 1750 wavenumbers. The room temperature spectrum (lower) is the infrared spectrum of a single layer of $C_3F_5O_2H$ that has chemisorbed onto the aluminum surface forming a carboxylate structure. This is evidenced by the loss of O—H and C═O modes in the infrared spectrum as compared with the 100 K spectrum and also by the two new modes at approximately 1670 and 1480 wavenumbers that are assigned to the anti-symmetric and symmetric modes of the carboxylate structure. FIG. 3 demonstrates how one vapor deposited monolayer of $C_3F_5O_2H$ inhibits oxide formation on the aluminum surface. The top spectrum is an IRRAS spectrum of clean aluminum following an exposure of 10,000 Langmuirs of oxygen. It demonstrates that oxide formation is evidenced by the presence of the mode at approximately 950 wavenumbers. The middle spectrum is an IRRAS spectrum of ½ monolayer of vapor deposited $C_3F_5O_2H$ on aluminum followed by the same 10,000 Langmuirs exposure of oxygen. It demonstrates that an aluminum oxide is still formed. The lower spectrum is an IRRAS spectrum of one monolayer of vapor deposited $C_3F_5O_2H$ on aluminum followed by a 10,000 Langmuirs exposure of oxygen. The spectrum has no apparent aluminum oxide mode at approximately 950 wavenumbers and demonstrates that the $C_3F_5O_2H$ coating inhibits oxidation.

Example 2

Metal Nanoparticles

Metal nanoparticles like nano-aluminum, available through vapor phase synthesis, etc., are coated through a vaporization process with a passivation layer which inhibits the oxidation of the metal. Currently in the vapor phase synthesis of metals, an inert gas condensation process is used to form and tailor the size of the metal particles. Following the gas condensation process, oxygen is introduced to passivate the metal surface. Instead, a vapor containing $C_3F_5O_2H$ and/or $CH_3CH_2O_2H$ along with the inert gas can be introduced to form a passivation layer, which inhibits oxidation of the metal (see FIG. 1). The vapor containing a carboxylic acid such as $C_3F_5O_2H$ and/or $CH_3CH_2O_2H$ can also be used to passivate the metal after the metal particles are formed but before oxygen is introduced to passivate the metal.

Example 3

(Prophetic) Electronic Wiring

Nano-scale or micron-scale electronic wiring is coated with a passivation layer, such as $C_3F_5O_2H$ and/or $CH_3CH_2O_2H$, onto an oxide-free or partially oxidized metal surface. The protective coating on the metal wire prevents its corrosion and oxidation. It would be beneficial in between small-spaced wires where oxidation or continued oxidation of the wiring would cause the wires to come in contact with one another thus causing a failure or changing the electrical behavior of the electronic device (e.g., capacitance or resistance). The coating maintains spacing between the wires that is small enough that oxidation of the wiring would cause the wires to come into contact with one another or change electrical or thermal conductivity. The coating maintains the spacing of the wiring, contacts, interconnects, as well as thermal and electrical conductivity of the wiring, contact and interconnects.

Example 4

(Prophetic) Passified Layer with Functional Groups

Functionalization of the metal surface or metal nanoparticle surface occurs as detailed in Example 1 or 2, with a difference in the passivation layer that is deposited onto the surface. The chemical property of the surface is thus tailored through the attachment of different functional groups and modification of the terminal end group allows for the assembly of explosive and/oxidizer compounds.

Example 5

Prophetic

An unprotected metal mass is formed by processing a composition of $AlH_3NR_1R_2R_3$, with $R_1$, $R_2$ and $R_3$ independently being hydrogen or an alkyl having from about 0 to about 10 carbon atoms, that are optionally in combination with one or more heterocycles. The process results in the formation of the protected metal mass. In one embodiment, the process of the present invention includes a solution of known concentration of $AlH_3NR_3$ (R=alkyl) in ether that is decomposed by the addition of a catalytic amount of $Ti(O^i Pr)_4$. After the decomposition is affected and the metal atoms begin to nucleate, a vaporized solution of perfluoroalkyl carboxylic acid is slowly introduced into the immediate atmosphere.

The foregoing summary, description, and examples of the present invention are not intended to be limiting, but are only exemplary of the inventive features that are defined in the claims.

What is claimed is:

1. A process for forming a protected metal mass, comprising:

forming an unprotected metal mass;

vaporizing a layer forming reactant; and, introducing the layer forming reactant, which is in a vapor form, onto an immediate environment of the unprotected metal mass prior to oxidation of said immediate environment of the unprotected metal mass, wherein the layer forming reactant reacts with the unprotected metal mass as an attached protective layer, to form said protected metal mass, and wherein said forming comprises a metal vapor condensed into said unprotected metal mass, which is in a solid, non-oxidized form.

2. The process of claim 1, wherein the unprotected metal mass is selected from at least one of the group consisting of aluminum, copper, iron, steel, boron, and nickel.

3. The process of claim 1, wherein the unprotected metal mass comprises aluminum.

4. The process of claim 1, wherein the layer forming reactant comprises a moiety selected from at least one of the group consisting of carboxylic acid derivative, alcohol derivative, thiol derivative, aldehyde derivative, and an amide derivative.

5. The process of claim 1, wherein the moiety comprises a carboxylic acid derivative.

6. A process for forming a protected metal mass, comprising:

forming an unprotected metal mass;

vaporizing a layer forming reactant; and, depositing the layer forming reactant, which is in a vapor form, onto the unprotected metal mass prior to expected oxidation of the unprotected metal mass, wherein the layer forming reactant binds to a surface of the metal mass as an attached protective layer, wherein the unprotected metal mass comprises micron-size aluminum particles, and wherein said forming comprises a metal vapor condensed into said unprotected, non-oxidized metal mass.

7. A process for forming a protected metal mass, comprising:

forming an unprotected metal mass;

vaporizing a layer forming reactant; and, depositing the layer forming reactant onto the unprotected metal mass prior to expected oxidation of the unprotected metal mass, wherein the layer forming reactant binds to a surface of the unprotected metal mass as an attached protective layer, wherein the unprotected metal mass comprises nano-size aluminum particles, and wherein said forming comprises a metal vapor condensed into said unprotected, non-oxidized metal mass.

8. The process of claim 1, wherein the attached protective layer comprises a monolayer.

9. The process of claim 8, wherein the monolayer comprises a moiety of a carboxylic acid derivative.

10. The process of claim 1, wherein the attached protective layer comprises from about 3 carbon atoms to about 12 carbon atoms.

11. The process of claim 1, wherein the layer forming reactant comprises $CH_3CH_2CO_2H$.

12. The process of claim 1, wherein the layer forming reactant comprises a moiety, said moiety comprises a perfluoroalkyl carboxylic acid.

13. The process of claim 4, wherein the carboxylic acid derivative is selected from one of $C_3F_5O_2H$, $C_5F_9O_2H$, $C_9F_{17}O_2H$, $C_{10}F_{19}O_2H$, $C_{14}F_{27}O_2H$, $C_3F_3O_2H_3$, $C_5F_7O_2H_3$ and $C_5F_5O_2H_5$.

14. The process of claim 4, wherein the carboxylic acid derivative comprises a perfluoroalkyl carboxylic acid, and wherein said perfluoroalkyl carboxylic acid comprises $C_3F_5O_2H$.

15. The process of claim 1, wherein the attached protective layer on the unprotected metal mass at least one of maintains and improves the metallic properties of the unprotected metal mass, with said metallic properties selected from at least one of the group consisting of electrical conductivity, thermal conductivity, ductility, and malleability.

16. The process of claim 1, wherein the attached protective layer includes at least one additional functional group.

17. The process of claim 1, wherein the attached protective layer includes an energetic moiety.

18. The process of claim 1, wherein the protected metal mass comprises a non-reactive protected metal mass in a non-inert environment.

19. A process for forming a protected metal mass, comprising:

forming an unprotected metal mass portion;

vaporizing a layer forming reactant; and, introducing the layer forming reactant, which is in a vapor form, onto an immediate environment of the unprotected metal mass portion prior to oxidation of said immediate environment of the unprotected metal mass, wherein the layer forming reactant reacts with the unprotected metal mass portion as an attached protective layer, to form said protected metal mass, wherein the layer forming reactant comprises a perfluoroalkyl carboxylic acid, wherein the attached protective layer comprises a thickness in a range of about 10 nm to about 100 nm, and wherein said forming comprises a metal vapor condensed into said unprotected metal mass, which is in a solid, non-oxidized form.

20. A process for forming a protected metal mass, comprising:

forming at least one of an unprotected metal mass and a portion of said unprotected metal mass;

vaporizing a layer forming reactant; and, introducing the layer forming reactant, which is in a vapor form, onto an immediate environment of the unprotected metal mass portion prior to oxidation of said immediate environment of the unprotected metal mass, wherein the layer forming reactant binds to the surface of the unprotected metal mass as an attached protective layer, to form said protected metal mass, wherein the layer forming reactant comprises a carboxylic acid derivative moiety, wherein the attached protective layer comprises a thickness in a range of about 10 nm to about 100 nm, and wherein said forming comprises a metal vapor condensed into said unprotected metal mass, which is in a solid, non-oxidized form.

21. The process of claim 1, wherein the protected metal mass comprises a protected aluminum mass product.

22. The process of claim 1, wherein the protected metal mass comprises an energetic material.

23. The process of claim 1, wherein the layer forming reactant comprises at least one of a carrion inhibitor and an oxide inhibitor.

24. The process of claim 1, wherein the attached protective layer comprises a thickness in a range of about 10 nm to about 100 nm.

25. A process for forming an oxide-free surface, comprising:

providing a mass, wherein said mass comprises a surface;

forming the oxide-free surface of the mass by removing an oxide layer of the mass by sputter cleaning the surface of the mass;

vaporizing a layer forming reactant; and, introducing the layer forming reactant, which is in a vapor form, onto the oxide-free surface of the mass prior to oxidation of the oxide-free surface, wherein the layer forming reactant reacts with the mass as an attached protective layer, to form a protected mass.

* * * * *